United States Patent [19]

Nakaham et al.

[11] Patent Number: 5,143,704
[45] Date of Patent: Sep. 1, 1992

[54] APPARATUS FOR MANUFACTURING SILICON SINGLE CRYSTALS

[75] Inventors: Yasumitsu Nakaham; Kenji Araki; Hiroshi Kamio, all of Tokyo, Japan

[73] Assignee: NKK Corporation, Tokyo, Japan

[21] Appl. No.: 722,259

[22] Filed: Jun. 27, 1991

Related U.S. Application Data

[63] Continuation-in-part of Ser. No. 500,798, Mar. 28, 1990, abandoned.

[30] Foreign Application Priority Data

Oct. 26, 1989 [JP] Japan ................................ 1-277094

[51] Int. Cl.$^5$ ................................................ B01D 9/00
[52] U.S. Cl. .................................. 422/248; 156/617.1; 156/618.1; 156/620.4; 156/DIG. 64; 422/249; 422/250
[58] Field of Search ............... 156/617.1, 618.1, 620.4, 156/DIG. 64; 422/248, 249, 250

[56] References Cited

U.S. PATENT DOCUMENTS 4,330,362  5/1982  Zulehner ........................ 156/617.1

FOREIGN PATENT DOCUMENTS

| | | |
|---|---|---|
| 0170856 | 2/1986 | European Pat. Off. ............ 422/249 |
| 0320115 | 6/1989 | European Pat. Off. . |
| 2245250 | 3/1974 | Fed. Rep. of Germany ...... 422/249 |
| 2821481 | 11/1979 | Fed. Rep. of Germany . |
| 63-89488 | 4/1988 | Japan . |

Primary Examiner—Robert Kunemund
Assistant Examiner—Felisa Garrett
Attorney, Agent, or Firm—Michael N. Meller

[57] ABSTRACT

In a silicon single crystal manufacturing apparatus of the type which continuously feeds starting material, a metallic heat keeping plate is arranged to cover a partition member dividing molten silicon into a single crystal growing section and a material melting section within a quartz crucible and an upper side of the material melting section. The metallic heat keeping plate is provided for the purpose of preventing the occurrence of solidification of the molten silicon on the inner side of the partition member and preventing excessive cooling of a silicon single crystal. The metallic heat keeping plate has a thickness of 3 mm or less and its material is tantalum or molybdenum. Further, the heat keeping plate includes a straight body portion formed with a plurality of openings for adjusting the temperature of the single crystal.

4 Claims, 5 Drawing Sheets

APPARATUS FOR MANUFACTURING SILICON SINGLE CRYSTALS

This is a continuation-in-part of U.S. Ser. No. 500,798 filed on Mar. 28, 1990, now abandoned.

BACKGROUND OF THE INVENTION

1. Field of the Invention

The present invention relates to an apparatus for manufacturing silicon single crystals by the Chochralski method.

2. Description of the Prior Art

In the field of LSIs, there has been a demand for yearly increase in the diameter of silicon single crystals. At present, crystals of 6 inches in diameter are used for the most modern devices. It has been said that in future crystals of 10 inches or over in diameter, e.g., crystals of 12 inches in diameter will be required.

The Chochralski method (CZ method) involves two concepts with respect to the crystal manufacturing method, that is, the first concept is a method in which a crucible is rotated and the second concept is a method in which a crucible is not rotated. Presently, all of CZ crystals used for LSIs are manufactured by a method of the type in which the crucible is rotated oppositely to the rotation of a crystal. Furthermore, the crucible is heated by an electric resistance heater mainly surrounding the side of the crucible. Despite a variety of attempts, silicon single crystals of over 5 inches in diameter have never been produced up to date and will not be produced in the future by the methods of non-rotation of the crucible or by using other heating processes than the above-mentioned heating process. The reason is that it is impossible to obtain a completely concentric temperature distribution with respect to a growing crystal without rotating the crucible or by using any heating process other than the previously mentioned heating process, such as by electromagnetic induction heating or by electric resistance heating applied to the bottom of the crucible. The growing of such a crystal is extremely susceptible to temperatures.

In the CZ method of the type which rotates the crucible (hereinafter referred to as the ordinary CZ method), the rotation of the crucible and the electric resistance side heating cause a strong convection of the molten silicon and the melt is agitated satisfactorily. Thus, the method is desirable for the growth of large-diameter single crystals. In other words, it is possible to obtain a melt surface temperature distribution which is uniform and which is completely concentric with respect to a crystal. Therefore, the present invention is based on the ordinary CZ method. As mentioned previously, there is a considerable difference in the flow of molten silicon between the ordinary CZ method and the other CZ method. This difference results in considerable difference in crystal growth condition between the two. Consequently, the two methods differ considerably with respect to the functions of the component parts within the furnace. The two methods differ entirely in terms of their concepts to the growth of crystals.

In the case of the ordinary CZ method, the amount of the melt in the crucible decreases with the growth of a crystal. Thus, as the crystal grows, the dopant concentration increases and the oxygen concentration decreases in the crystal. In other words, the properties of the crystal vary along its growth direction. This problem must be solved in view of the fact that paralleling the trend toward increasing the density of LSIs, the quality required for silicon single crystals has become increasingly critical from year to year.

Figure 7:
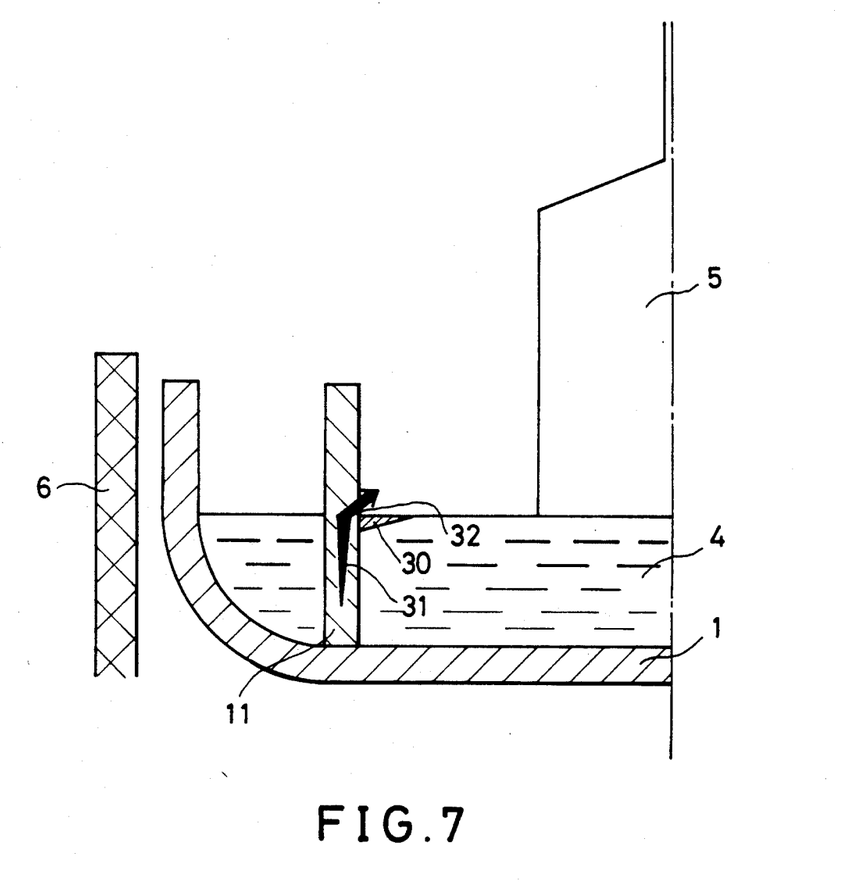
FIG. 7 is a schematic diagram showing the manner in which the molten silicon solidifies at the partition member.

As a means of solving this problem, there is known a prior method in which the interior of a quartz crucible according to the ordinary CZ method is divided by a cylindrical quartz partition formed therethrough with a hole or holes so that the molten silicon can pass through whereby a cylindrical silicon single crystal is grown on the inner side of the partition while feeding silicon starting material to the outer side of the partition member (e.g., Patent Publication No. 40-10184, P1, L20-L35). As pointed out in Japanese Laid-Open Patent No. 62-241889 (P2, L12-L16), the major problem of this method is that a solidification 30 of molten silicon tends to occur starting at the partition member on the inner side thereof (see FIG. 7). This is caused by the following fact. As will be seen from the use of quartz for optical fiber, the quartz partition member efficiently transmits heat by radiation. The heat in the molten silicon is transmitted as light upwardly through the partition member and the heat is dissipated from the portion of the partition member which is exposed from the molten silicon surface.

Therefore, the melt temperature is decreased considerably in the vicinity of the partition member. Also, in accordance with the ordinary CZ method, the surface temperature of the melt is not only uniform but also just above the solidification temperature of the melt due to vigorous agitation of the melt. With these facts coupled together, the melt surface in contact with the partition member is in such condition as to have a very great tendency to cause the solidification 30. In order to overcome this deficiency, Japanese Laid-Open Patent No. 62-241889 proposes a method which uses no partition member. However, this method has not been put in practical use since the material melting section is limited and thus the material melting capacity is extremely low.

Where a single crystal is pulled while continuously and directly feeding granular silicon into the crucible in accordance with the previously mentioned conventional techniques, the following problems are encountered.

(1) Where the crucible is divided into a granular silicon melting section and a single crystal pull section, solidification of the melt tends to occur from the inner side of the partition member. Then, once the solidification occurs, it continues to grow thus impeding the growth of a sound single crystal.

(2) With a view to solving this problem, if the partition member and the material melting section are covered by a heat keeping plate ensuring a large amount of heat transfer within the plate surface, a crystal to be pulled itself is cooled by the heat plate. As a result, the temperature gradient in the crystal deviates from the single crystal growth enabling temperature region, thus impeding the growth of a sound crystal.

(3) During the pulling of a silicon single crystal, the temperature of the melt is considerably close to the melting point of silicon. In this condition, if granular silicon which temperature close to the room temperature is fed continuously, the granular silicon is not melted completely and thus floats in its solid condition to the surface of the melt, thereby causing the melt to solidify and grow with the granular silicon as a nucleus.

SUMMARY OF THE INVENTION

It is therefore an object of the present invention to provide an improved silicon single crystal manufacturing apparatus in which a partition member and a material melting section on the outer side of the partition member are covered by a metallic heat keeping plate of 3 mm in thickness or less, preferably from 1.5 to 3 mm in thickness.

Tantalum or molybdenum is used as the material for the metallic heat keeping plate. Also, its straight body portion is formed with a plurality of openings.

This construction has the effect of preventing the following:

(1) Where the crucible is divided into a material melting section and a single crystal growing section, the solidification of the melt from inside the partition member.

(2) The impediment to the growth of a sound crystal in the case where the partition member and the material melting section are covered by a heat keeping plate having a large amount of heat transfer within its plate surface.

(3) The solidification of the molten silicon in the material melting section.

For instance, as a means of preventing a) the solidification of the molten silicon in the material melting section and b) the solidification of the melt from the inner side of the partition member in a case where the crucible is divided into the material melting section and the single crystal growing section, it is conceivable to cover the partition member separating the material melting section and the single crystal growing section and above the material melting section with a heat keeping plate. Since a carbon material is usually used as a hot-zone structural member for silicon single crystals, a carbon material is first thought of as the material for the heat keeping plate.

In this case, however, the material must be at least 5 mm in thickness from the strength point of view. As a result, the amount of heat transfer within the plate surface increases. In other words, this results in an increase in the amount of heat transfer from the high temperature portion of the heat keeping plate just above the melt to the upper part of the heat keeping plate held at a low temperature by radiation between the water cooled furnace wall and the upper surface of the heat keeping plate. In other words, the heat of the heat keeping plate just above the melt, which is important for the growth of a crystal, is rapidly dissipated by the transfer within the heat keeping plate. As a result, the temperature of this portion can barely reach about 1000° C. at the most.

Therefore, while the provision of the heat keeping plate has a heat keeping effect on the partition member and the material melting section, it has a forced cooling action on the crystal.

In accordance with the present invention, the material for the heat keeping plate is a metal and its thickness is selected to be 3.0 mm or less. A preferred embodiment is where the heat keeping plate is between 1.5 and 3.0 mm in thickness. In other words, the use of the metal makes it possible to form the heat keeping plate of less than 3.0 mm in thickness. As a result, the quantity of heat transfer within the plate surface of the heat keeping plate can be extremely reduced as compared with that of the carbon material. Thus, the temperature of the heat keeping plate just above the melt excess 1300° C. and previously mentioned crystal cooling action caused by the heat keeping plate is reduced. Depending on the circumstances, the temperature gradient of the crystal at the solid liquid interface can be reduced as compared with the case without the heat keeping plate. A computer simulation has shown that where the thickness is reduced to less than 1.5 mm and tantalum is used for the material, the temperature gradient of the crystal at the solid-liquid interface can be reduced as compared with the case without the heat keeping plate.

Also, by increasing the temperature of the heat keeping plate just above the melt, it is possible to increase the heat keeping effect on the partition member and the molten silicon in the material melting section. In other words, it is possible to accomplish more completely the first object of providing the heat keeping plate, that is, the prevention of 1) the solidification of the melt from the inner side of the partition member in the case where the material melting section and the single crystal growing section are separated from each other and 2) the solidification of the molten silicon in the material melting section.

Tantalum or molybdenum is particularly desirable as the metal material for the heat keeping plate. The reason is that its high temperature strength at over 1400° C. is high and its reactivity with SiO at high temperatures of over 1400° C. is low compared with other metals. Since a high temperature SiO gas is present in the crystal growing furnace, its low reactivity with SiO is a desirable condition for the hot-zone structural member.

Also, the openings formed in the straight body portion of the metallic heat keeping plate has the effect of adjusting the cooling rate of a crystal and making proper the environment of the crystal.

DESCRIPTION OF THE PREFERRED EMBODIMENTS

Figure 1:
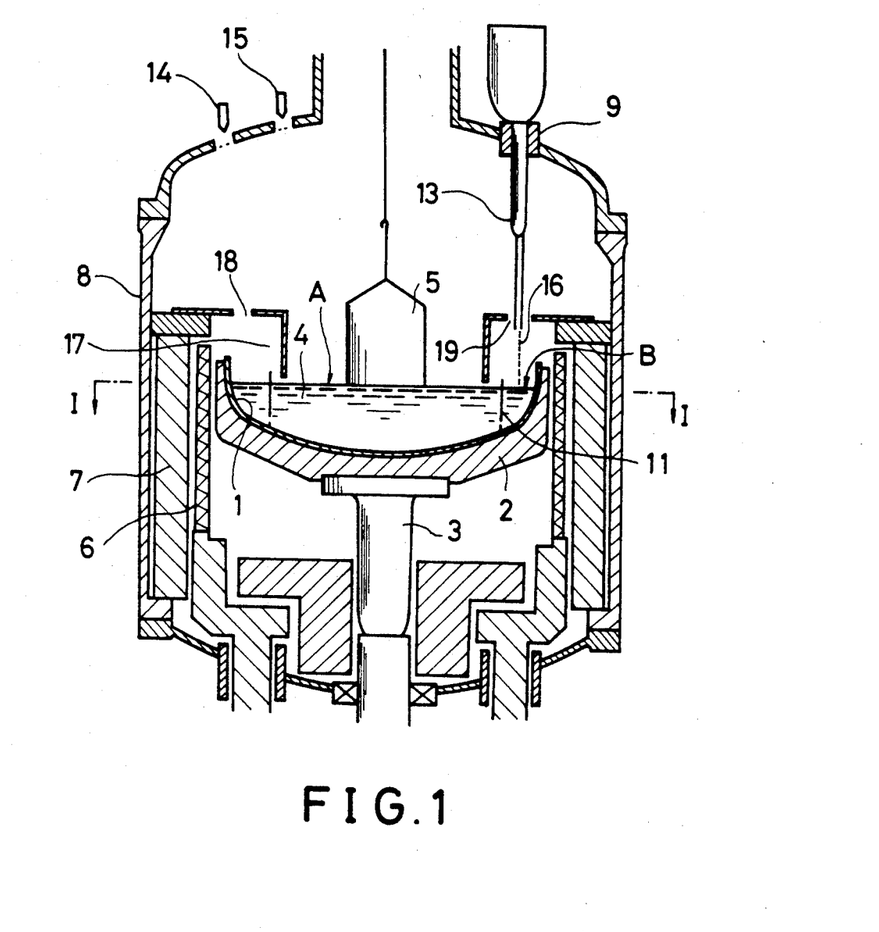
FIG. 1 is a longitudinal sectional view showing schematically an embodiment of the present invention.
Figure 2:
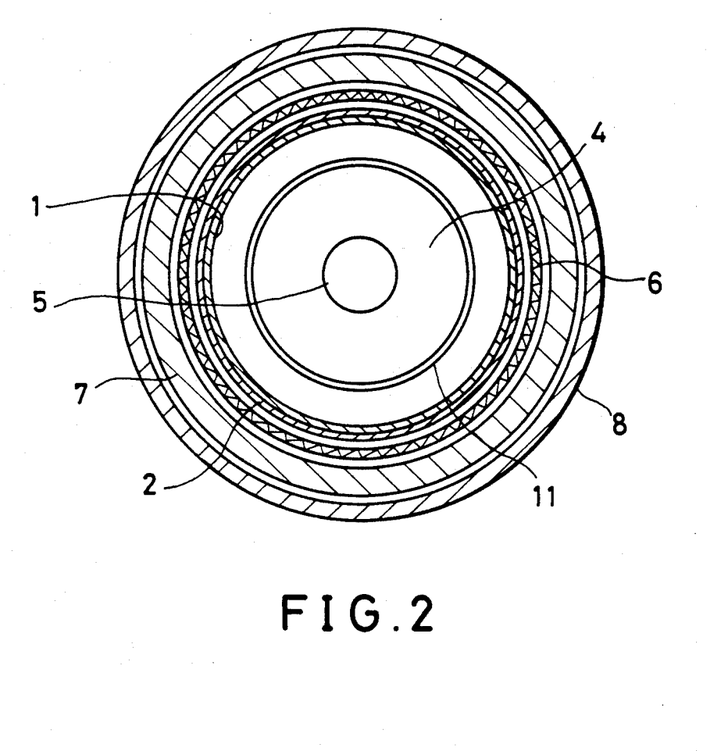
FIG. 2 is a sectional view taken along the line I—I of FIG. 1.

FIG. 1 is a sectional view showing schematically an embodiment of the present invention, and FIG. 2 is a sectional view taken along the line I—I of FIG. 1. In the Figures, numeral 1 designates a quartz crucible which is set in a graphite crucible 2. The graphite crucible 2 is vertically movable and rotatably supported on a pedestal 3. Numeral 4 designates molten starting material contained in the crucible 1 from which a single crystal 5 grown into a cylindrical shape is pulled while being rotated. Numeral 6 designates an electric resistance heater enclosing the graphite crucible 2, and 7 a hot-zone heat insulator enclosing the heater 6. These component parts are accommodated in a chamber 8. The foregoing construction is basically the same with the construction of the ordinary silicon single crystal manufacturing apparatus according to the Chochralski method.

Figure 3:
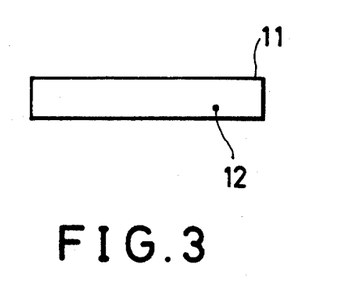
FIG. 3 is a side view of an embodiment of the partition member.

Numeral 11 designates a partition member made from high purity quartz and arranged concentrically within the crucible 1. As shown by way of example in FIG. 3, one or a plurality of small holes 12 are formed in the region below substantially the middle portion in the height direction of the partition member 1. Thus, the molten silicon on the outer side of the partition member 11 (hereinafter referred to as a material melting section B) is smoothly moved only through the small hole(s) 12 to the inner side of the partition member 11 (hereinafter referred to as a single crystal growing section A).

Numeral 9 designates an opening formed in the chamber 8 above the material melting section B. Fixedly inserted in the opening 9 is a feeder 13 for feeding granular or lumpy silicon (hereinafter referred to as granular silicon). The lower end of the feeder 13 is arranged above the surface of the molten silicon in the material melting section B. The feeder 13 continuously feeds granular silicon 16 onto the material melting section B.

Figure 4:
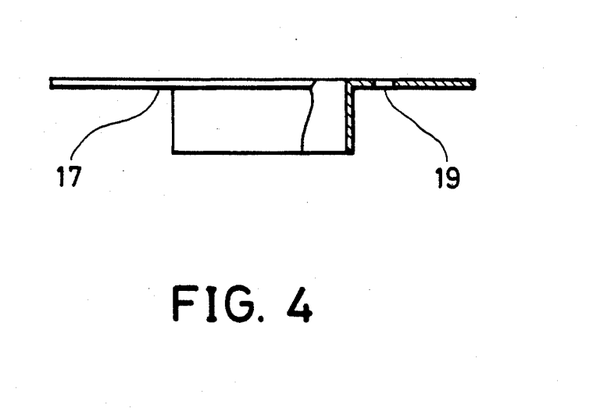
FIG. 4 is a side view of an embodiment of the metallic heat keeping plate.

Numeral 17 designates a metallic heat keeping plate which is composed of a tantalum plate of 1.5 mm in thickness as shown in FIG. 4. The metallic heat keeping plate 17 is supported at its outer peripheral portion on the hot-zone heat insulator 7 and it is set so as to enclose the partition member 11 and the material melting section B. The bottom (inner peripheral portion) of the metallic heat keeping plate 17 is arranged close to the surface of the melt (in this embodiment at a distance of about 10 mm). This is done for the purpose of preventing the melt from solidifying starting at the inner wall of the partition member 11 and enhancing the heat keeping effect on the molten silicon in the material melting section B.

Numeral 18 is designates a hole formed in correspondence to the field region of a temperature detector 14, numeral 19 designates a hole formed in the feed path of the granular silicon 16.

With the construction described above, the operation of the present embodiment will now be described. The molten silicon 4 is contained on both the inner and outer sides of the partition member 11 arranged inside the crucible 1 and the molten silicon surfaces on the both sides are maintained at the same level. Now, a seed crystal is dipped in the surface of the melt in the single crystal growing section A and it is then pulled gradually while rotating it. At this time, the growth of a crystal takes place along with the solidification at the solid-liquid interface thereby producing a cylindrical silicon single crystal 5. During the interval, the granular silicon 16 is continuously fed from the feeder 13 onto the surface of the molten silicon in the material melting section B so that the granular silicon 16 is melted by the molten silicon in the material melting section B. The melted silicon is smoothly moved to the single crystal growing section A through the small hole(s) 12 of the partition member 11 thereby always maintaining constant the liquid level of the molten material 4. At this time, the partition member 11 blocks the ripples caused by the feeding of the granular silicon 16 onto the surface of the molten silicon in the material melting section B. Thus, these ripples are not propragated to the single crystal growing section A.

It is to be noted that the reason for positioning the lower end of the starting material feeder 13 above the molten silicon surface without dipping it in the molten silicon to cause the granular silicon 16 to fall on the molten silicon surface is to allow the granular silicon 16 to float on the molten silicon surface in the whole area of the material melting section B so as to be melted in the whole area of the material melting section B.

Figure 5:
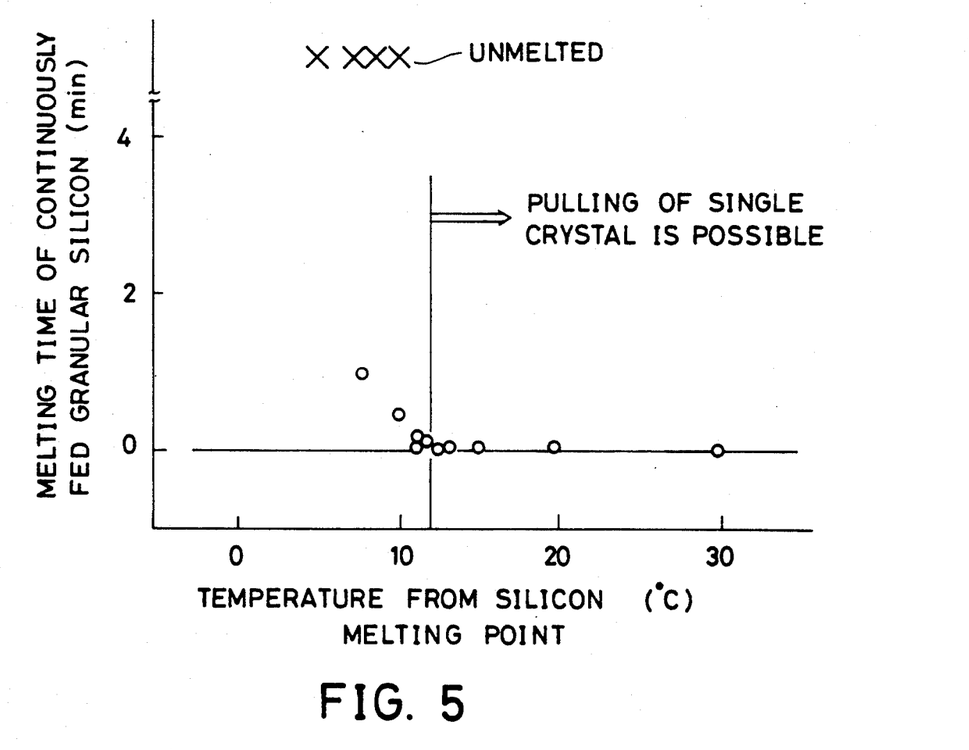
FIG. 5 is a graph showing the relation between the melting time of granular silicon and the temperature deviating from the silicon melting point.

On the other hand, the results of temperature measurement tests have shown the following fact. In order to pull a sound silicon single crystal 5 while preventing the continuously fed granular silicon 16 from causing solidification of the molten silicon and also preventing the occurrence of solidification of the melt from the inner side of the partition member, the temperature of the molten silicon in the material melting section B must be higher than the melting point of silicon by at least 12° C. as shown in FIG. 5. These conditions can be easily satisfied by the provision of the metallic heat keeping plate 17. Moreover, there is the effect of preventing any excessive cooling of a crystal and ensuring the growth of a sound crystal.

The above-described embodiment shows the case in which the single feeder 13 is used for continuously feeding the granular silicon 16 onto the surface of the molten silicon in the material melting section B. However, two or more units of the feeder 13 may be provided.

Further, in addition to the above-mentioned embodiment heat transfer simulations of crystals and heat keeping plates have been made by numerical calculations. The results have shown that where the material is tantalum and the thickness of the heat keeping plate 3 mm, the temperature gradient of a crystal at the solid-liquid interface is substantially the same as in the case without any heat keeping plate. Thus, it will be seen that in order to make possible the growth of a sound crystal, at is necessary to select the thickness of the heat at 3 mm or less and, even if the keeping plate is made of metal, its thickness can be as low as 1.5 mm, preferably 1.5 to 3.0 mm in thickness.

Figure 6A:
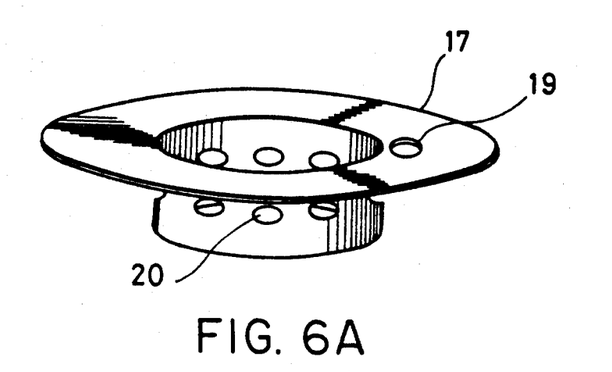
FIGS. 6(A) and 6(B) are respectively a perspective view and side view of another embodiment of the metallic heat keeping plate.
Figure 6B:
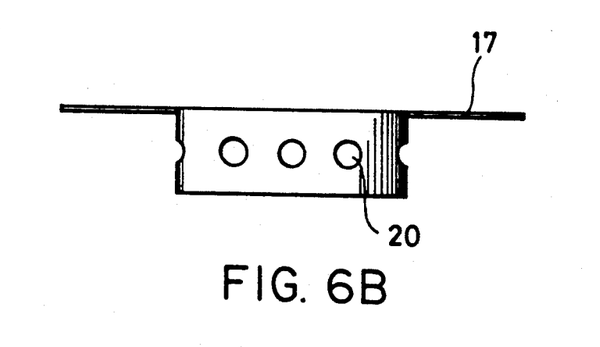

Referring now to FIGS. 6A and 6B, there are illustrated a perspective view and side view of another embodiment of the metallic heat keeping plate. A plurality of openings 20 are formed in the straight body portion of the metallic heat keeping plate 17. These openings are provided to adjust the degree of cooling of a crystal. In other words, the high temperature radiation from the inner wall of the graphite crucible 2 is allowed to directly reach the crystal through the openings 20. As a result, an adjustment of the area of the openings results in an adjustment of the degree of cooling of the crystal. To vary the area of the openings for the purpose of adjusting the degree of cooling the crystal is equivalent to changing the thickness and material of the heat keeping plate and this is simple.

In accordance with this embodiment, the metallic heat keeping plate 17 having the plurality of openings 20 and a thickness of 0.3 mm (FIGS. 6A and 6B) is used in the silicon single crystal manufacturing apparatus shown in FIG. 1. With the metallic heat keeping plate 17, the ratio of the opening area to the surface area of the straight body portion is 30% and the material is molybdenum. The manufacture of 6 in. silicon single crystals is ensured.

Also, while in the embodiment of FIGS. 6A and 6B, the openings 20 are circular in shape, they are not limited to the circular shape. Moreover, there will be no inconvenience even if the openings 20 are provided in the form of cutouts in the lower end of the metallic heat keeping plate.

The present invention has the following effects. The present invention has a heat keeping plate. The material of the heat keeping plate is a metal and its thickness is selected at or less than 3 mm, thereby preventing the occurrence of solidification of the melt at the partition member on the inner side thereof. In addition, there is the effect of reducing the temperature gradient of a crystal at the solidification interface to about the same level as in the case where no heat keeping plate is used. Also, the temperature of the molten silicon in the material melting section is maintained higher than the melting point of silicon by more than 12° C., thereby preventing solidification of the molten silicon in the material melting section. As a result, the pulling out of a sound silicon single crystal is ensured. Thus, the working of the present invention has great effects that the uniform quality of a crystal along the pull direction is ensured thus realize the improved yield and the enhanced productivity and so on.

Also, the openings formed in the straight body portion of the metallic heat keeping plate serve the function of adjusting the degree of cooling of a crystal to ensure proper environments for the crystal.

What is claimed is:

1. An apparatus for manufacturing columnar single silicon crystals with a diameter of 12 cm–30 cm, having a rotating crucible and heated by an electric resistance heater surrounding the side wall of said crucible which comprises:

(a) a fused quartz cylindrical partition member separating the crucible into a material melting section and a single crystal growing section, said partition member fixed to the bottom of the crucible, the top thereof being arranged as projecting above the surface of the molten silicon and having a plurality of small holes through which molten silicon can flow only in one direction, that is, from the materials melting section to the single crystal growing section;

(b) means for introducing granular silicon or chunks of silicon, into said material melting section; and (c) a heat keeping plate consisting of a disk-like member having a round opening at its center and a hole for introducing said granular silicon or chunk of silicon and a cylindrical member connected to the inner periphery of said opening, covering only the surface of the molten silicon in the raw materials melting area and the top and the inner side of the partition projecting above the surface of molten silicon, wherein said disk-like member and said cylindrical member consist essentially of a tantalum or molybdenum plate which has a thickness of 3 mm or less.

2. An apparatus according to claim 1, wherein said metallic heat keeping plate includes a straight body portion formed with a plurality of openings.

3. An apparatus according to claim 1, wherein said heat keeping plate has a thickness of 1.5 mm to 3.0 mm.

4. An apparatus according to claim 2, wherein said metallic heat keeping plate has a thickness of 1.5 mm to 3.0 mm.

* * * * *

UNITED STATES PATENT AND TRADEMARK OFFICE
CERTIFICATE OF CORRECTION

PATENT NO. : 5,143,704

DATED : September 1, 1992

INVENTOR(S) : NAKAHAMA, et al

It is certified that error appears in the above-identified patent and that said Letters Patent is hereby corrected as shown below:

ON THE TITLE PAGE, UNDER "UNITED STATES PATENT"

CHANGE "Nakaham et al." to

--Nakahama et al.--

At item [75], amend "Nakaham" to read

--Nakahama--

Signed and Sealed this

Eighth Day of December, 1992

*Attest:*

DOUGLAS B. COMER

*Attesting Officer*     Acting Commissioner of Patents and Trademarks